United States Patent
Suyama et al.

(10) Patent No.: US 6,418,182 B1
(45) Date of Patent: Jul. 9, 2002

(54) BI-DIRECTIONAL SHIFT REGISTER HAVING BI-DIRECTIONAL SHIFT FUNCTION WITHOUT DETERIORATING DATA WITH A REDUCED NUMBER OF ELEMENTS

(75) Inventors: Noriaki Suyama; Yasunori Okimura, both of Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/239,111

(22) Filed: Jan. 28, 1999

(30) Foreign Application Priority Data

Jan. 28, 1998 (JP) .......................................... 10-015689

(51) Int. Cl.⁷ .............................................. G11C 19/00
(52) U.S. Cl. ............................. 377/69; 377/79; 327/202
(58) Field of Search .............................. 377/26, 69, 77, 377/78, 79; 327/202, 203

(56) References Cited

U.S. PATENT DOCUMENTS

| | | | | |
|---|---|---|---|---|
| 4,495,628 A | * | 1/1985 | Zasio | ........................... 377/70 |
| 4,679,213 A | * | 7/1987 | Sutherland | .................... 377/69 |
| 4,873,665 A | * | 10/1989 | Jiang et al. | .................... 377/69 |
| 4,899,307 A | * | 2/1990 | Lenosli | ........................ 365/78 |
| 5,138,641 A | * | 8/1992 | Mehta | ......................... 377/69 |
| 5,390,199 A | * | 2/1995 | Ajima et al. | ............... 371/67.1 |

FOREIGN PATENT DOCUMENTS

| | | | |
|---|---|---|---|
| JP | 62-9597 | 1/1987 | |
| JP | 7-13513 | 1/1995 | ............ G09G/3/36 |

* cited by examiner

*Primary Examiner*—Tuan T. Lam
(74) *Attorney, Agent, or Firm*—Katten Muchin Zavis Rosenman (57) ABSTRACT

A bi-directional shift register comprises flip-flops connected to first switches and second switches. Third switches are connected in sequence and between the respective flip-flops. The third switches are on-off controlled in accordance with a CLK signal in order to periodically transition from low to high or from high to low. The shift register opens the second switches during the low duration of the REV signal and opens and closes the first switches in accordance with clocking of the CLK signal to shift data in the forward direction. The shift register opens the first switches during the high duration of the REV signal and opens and closes the second switches in accordance with the clocking of the CLK signal to shift data in the reverse direction.

4 Claims, 9 Drawing Sheets

BI-DIRECTIONAL SHIFT REGISTER HAVING BI-DIRECTIONAL SHIFT FUNCTION WITHOUT DETERIORATING DATA WITH A REDUCED NUMBER OF ELEMENTS

BACKGROUND OF THE INVENTION

This invention principally relates to a bi-directional shift register for shifting data in a forward direction or in a reverse direction.

In general, an address selector may be composed of a bi-directional shift register connected to switching elements which are connected to a data bus line and DRAM memory cells arranged between two paralleling word lines and digit lines in a number corresponding to respective switching elements via the same number of sense amplifiers connected with the switching elements.

The bi-directional shift register here is disposed such that an input signal (REV signal, CLK signal, STA signal) is inputted at a control signal generator, where a different control signal is generated for controlling operation of a predetermined number of flip-flops. An output signal (address selecting signal) is obtained from inner contacts which are not simultaneously at a high level in specific one of respective flip-flops in accordance with the control signal.

By the way, in the case of the bi-directional shift register here, in order to use as an address selector, data is extracted from the inner contacts which are not simultaneously at a high level, and subsequently only an address selecting signal can be extracted from each two flip-flops composing the shift register. A problem arises in terms of integration degree as a semiconductor integrated circuit.

Thereupon, a bi-directional signal transmission circuit network and a bi-directional signal transfer shift register disclosed in Japanese Patent Publication Tokkai Hei 7-13513 (13513/1995) provide two data paths in a bi-directional shift register to implement improvement in the function of the integration degree.

In the case of the bi-directional shift register disclosed in the above described Japanese Patent Publication Tokkai Hei 7-13513, a problem arises that a feature thereof is easily deteriorated on account of the difference in data transfer speed, as will be described later.

SUMMARY OF THE INVENTION

It is an object of this invention to provide a bi-directional shift register having a bi-directional shift function without deteriorating data with a reduced number of elements.

It is another object of this invention to provide a bi-directional shift register capable of improving the integration degree as a semiconductor integrated circuit.

According to a first aspect of this invention, there is provided a bi-directional shift register comprising a predetermined number of flip-flops having first switching elements and second switching elements. The first switching elements being controlled to on and off states in accordance with a first control signal, the second switching elements being controlled to on and off states in accordance with a second control signal. A plurality of third switching elements are connected sequentially between the flip-flops to constitute a multistage structure, the third switching elements being controlled to on and off states in accordance with a third control signal which is for use in shifting the data by periodically clocking from a low level to a high level or from a high level to a low level.

The third control signal is a clock signal. The bi-directional shift register further comprises control producing means for producing first fourth though clock signals different from one another in accordance with the clock signal and an REV signal which is for use in controlling a shift direction of data. The control producing means puts the third and the fourth clock signals into a low level and a high level, respectively, to make the first switching elements be open when the data are shifted to the forward direction. The control producing means puts the first and the second clock signals into a low level and a high level, respectively, to make the second switching elements be open when the data are shifted to the reverse direction.

According to a second aspect of this invention, there is provided an address selector comprising the above-mentioned bi-directional shift register. The address selector comprises output means connected to the bi-directional shift and having a plurality of output terminals for making one of the output terminals be a high level to output an output signal as an address select signal.

According to a third aspect of this invention, there is provided an FIFO/LIFO circuit comprising the above-mentioned address selector. The FIFO/LIFO circuit has an FIFO function which sequentially selects an address. Furthermore, the FIFO/LIFO circuit has an LIFO function which sequentially selects an address in reverse order. The output means inputs the REV signal as a selection control signal and connects two sets of lines of the bi-directional shift register to form two groups of output terminals. The output means comprises an output selector circuit for selectively outputting either one of the two groups of output terminals in accordance with the selection control signal.

DESCRIPTION OF THE PREFERRED EMBODIMENT

Figure 1:
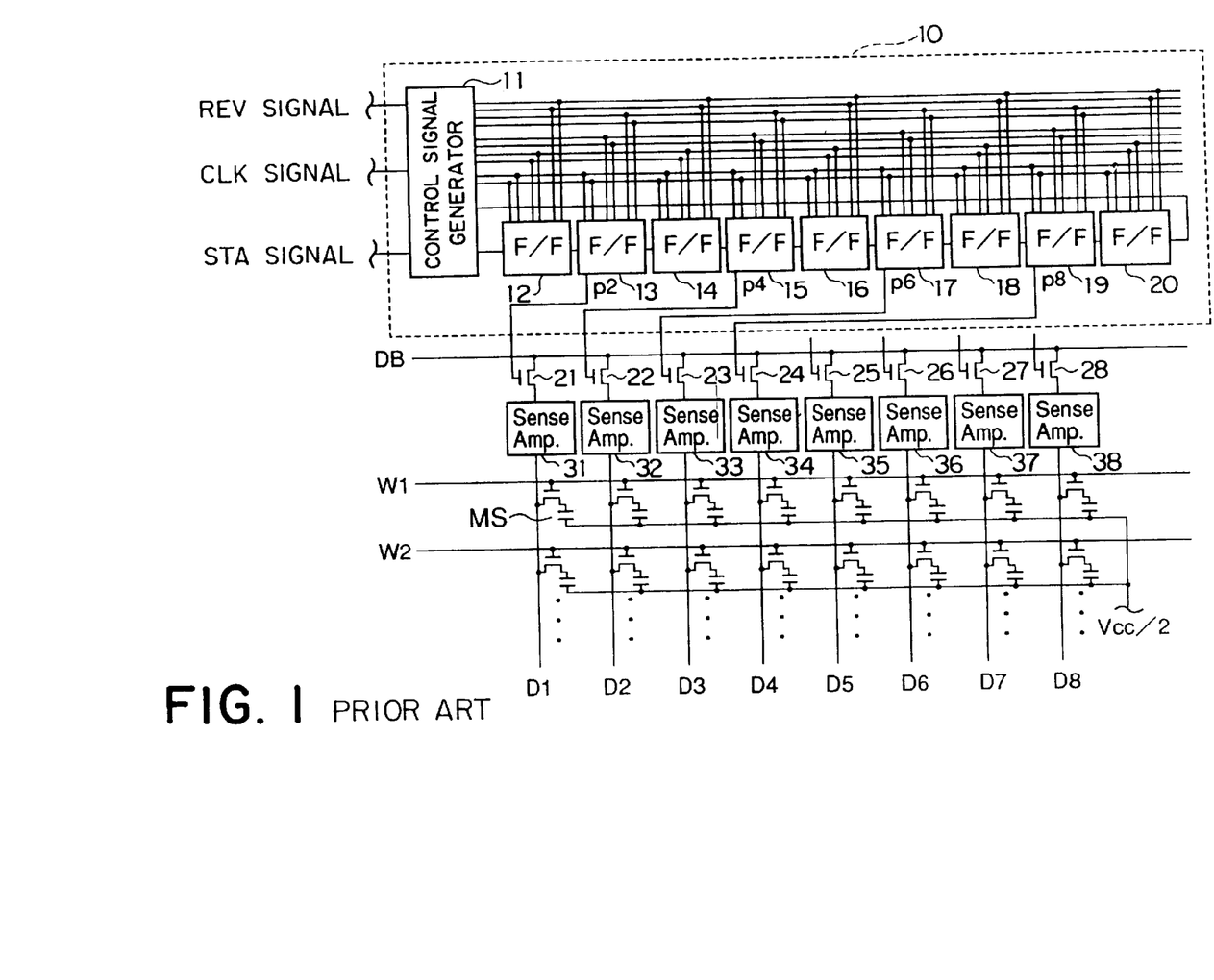
FIG. 1 is a block diagram of an address selector using a conventional bi-directional shift register.

Referring to FIG. 1, description will be made as regards a conventional bi-directional shift register for a better understanding of this invention. A bi-directional shift register may be used in an address selector as illustrated in FIG. 1. The address selector is composed of a bi-directional shift register 10, shown by a dotted line. The bi-directional shift register 10 comprises a control signal generator 11 which is supplied with an REV signal, a CLK signal, and an STA signal. The control signal generator 11 is connected to flip-flops 12 to 20. Furthermore, the flip-flops 12 to 20 are connected in series. The bi-directional shift register 10 is connected to eight switching elements 21 to 28 connected to a data bus line DB and DRAM memory cells MS through sense amplifier 31 to 38. A source voltage of Vcc/2 is applied to the DRAM memory cells. The DRAM memory cells are arranged between two paralleling word lines W1, W2 and digit lines D1–D8 in a number corresponding to respective switching elements via the same number of sense amplifiers connected with the switching elements.

The bi-directional shift register is disposed such that an input signal(REV signal, CLK signal, STA signal) is inputted at a control signal generator, where a different control signal is generated for controlling operation of a predetermined number (the predetermined number may be equal to nine) of flip-flops (hereinafter referred to as F/Fs), and an output signal (address selecting signal) is obtained from an inner contact p2, p4, p6, p8, which are not simultaneously at a High level in specific one of respective F/Fs in accordance with the control signal.

By the way, in the case of the bi-directional shift register here, in order to use as an address selector, data is extracted from the inner contacts p2, p4, p6, p8, which are not simultaneously at a High level, and subsequently only an address selecting signal can be extracted from each two FIFs composing the shift register, and a problem arises in terms of integration degree as a semiconductor integrated circuit.

Figure 2:
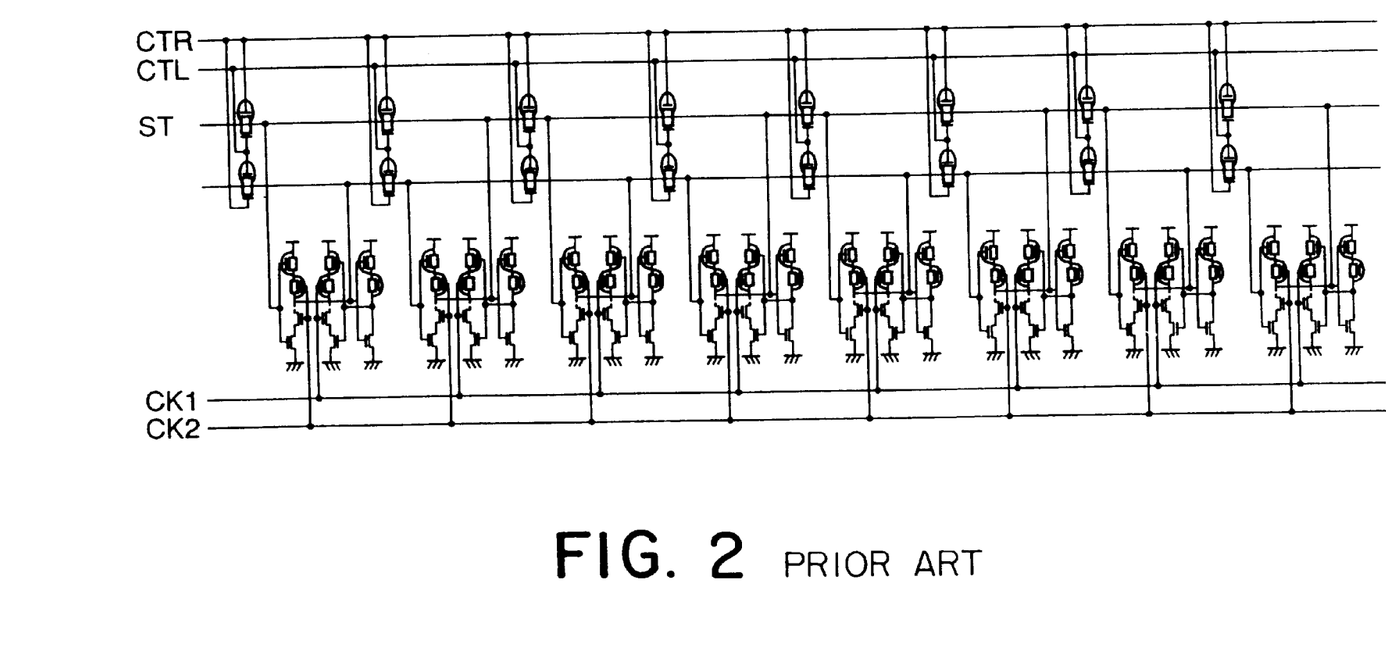
FIG. 2 is a circuit diagram of another conventional bi-directional shift register.

Thereupon, a bi-directional signal transmission circuit network and a bi-directional signal transfer shift register disclosed in Japanese Patent Publication Tokkai Hei 7-13513 (13513/1995) provide two data paths in a bi-directional shift register as illustrated in FIG. 2 to implement improvement in the function of the integration degree. Still more, the bi-directional shift register here is constituted by combining an NMOS transistor of which all switching elements are uncircled in the figures with a PMOS transistor of which all switching elements are encircled in the FIG. 2.

Figure 3A:
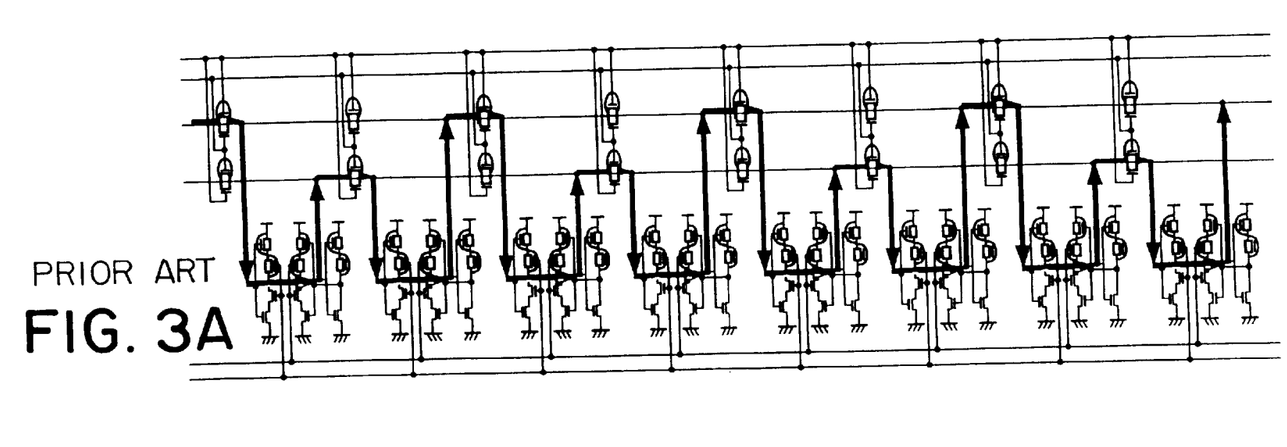
FIG. 3A is a flow chart for describing a forward direction shifting in the bi-directional shift register illustrated in FIG. 2.
Figure 3B:
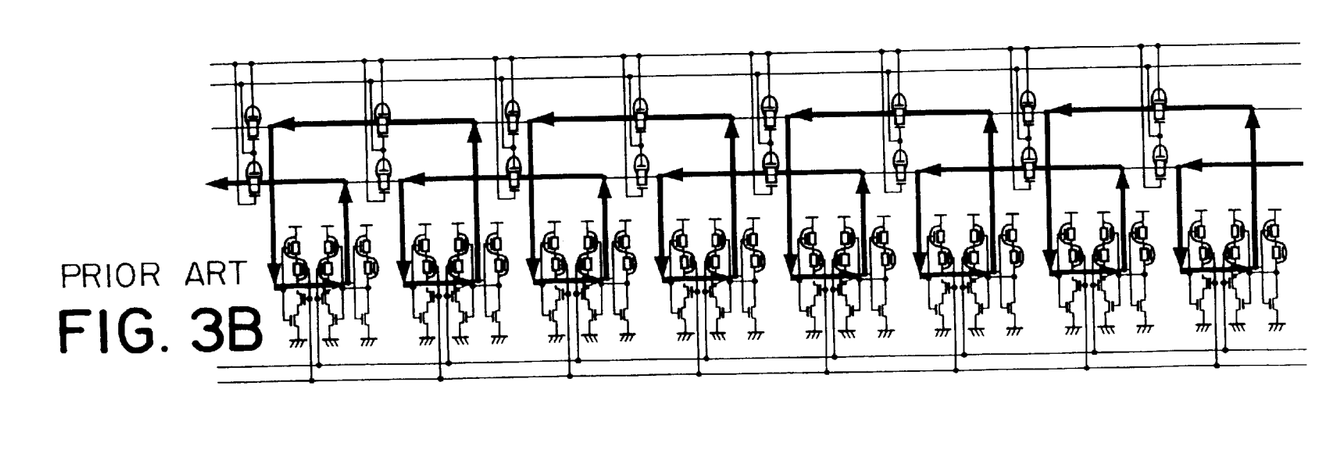
FIG. 3B is a flow chart for describing a reverse direction shifting in the bi-directional shift register illustrated in FIG. 2.

In the case of the bi-directional shift register disclosed in the above described Japanese Patent Publication Tokkai Hei 7-13513, although two data paths are provided to improve integration degree, actually, as shown in FIGS. 3A and 3B, because the number of switching elements composing the shift register (hereinafter referred to only as the number of elements) is large, the integration degree is not so much improved, and additionally, as the shift register is of a structure subjected to pass through a different data path, a problem arises that a feature thereof is easily deteriorated on account of the difference in data transfer speed. As illustrated in FIGS. 3A and 3B, when the flow passes a different data path in a forward route and in a reverse route, data transfer speed is different in the forward route and in the reverse route to possibly deteriorate the feature.

Figure 4:
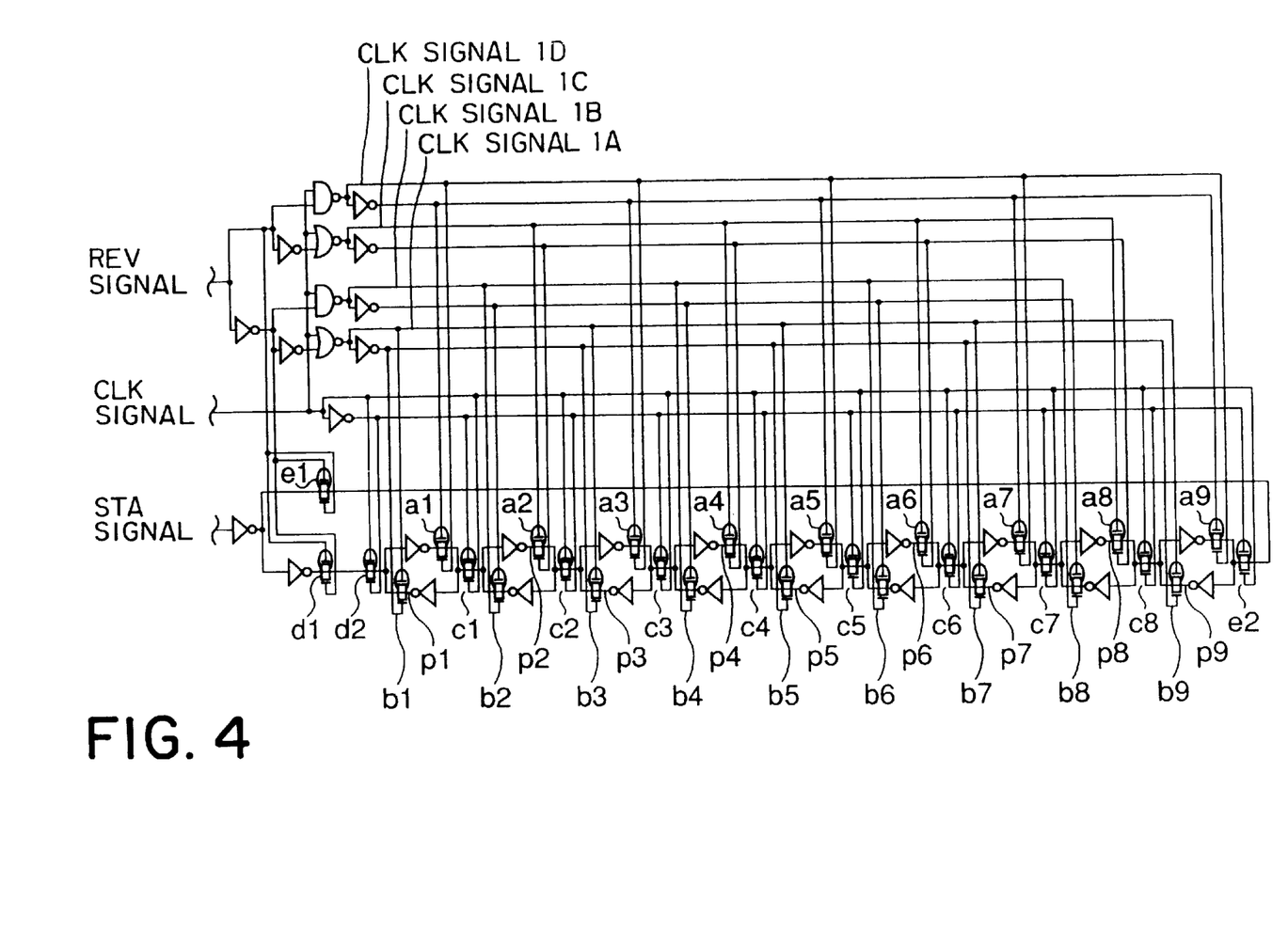
FIG. 4 is a circuit diagram of bi-directional shift register according to a preferred embodiment of this invention.

Referring to FIG. 4, description will proceed to a bi-directional shift register according to a preferred embodiment of this invention. The bi-directional shift register comprises a predetermined number (the predetermined number may be equal to nine of F/Fs composed of inverters connected with two groups of switching elements, including first switching elements a1–a9 that are normally on during a Low level duration of the REV signal for controlling a shift direction of data, while it is inputted, and second switching elements b1–b9 that that are normally on during a High level duration of the REV signal, while it is inputted, and a plurality of third switching elements c1–c8 connected in sequence and between respective F/Fs to constitute a multistage structure, and on-off controlled by the CLK signal which is a basic signal for shifting data by periodically clocking from a Low level to a High level or from a High level to a Low level.

In the case of the bi-directional shift register, data may be shifted in the forward direction during a Low level duration and in the reverse direction during a High level duration of the REV signal, and the data may be inputted into the inside of the shift register by the STA signal, and at this moment the data is arranged to be fed to the interior of the shift register via switching elements d1, e1, which are controlled by the REV signal, and switching elements d2, e2, which are controlled by the CLK signal.

Moreover, in the case of this bi-directional shift register, an arrangement is made such that the switching elements a1–a9 are normally on during a Low level duration of the REV signal and the switching elements b1–b9 are turned on and turned off in accordance with the clocking of the CLK signal to shift data in the forward direction, and the switching elements b1–b9 are normally on during a High level duration of the REV signal and the switching elements a1–a9 are turned on and turned off in accordance with the clocking of the CLK signal to shift data in the reverse direction.

Consequently, the bi-directional shift register includes a control signal generator for generating and outputting a different first CLK signal 1A, second CLK signal 1B, third CLK signal 1C, and fourth CLK signal 1D, based on the CLK signal and the REV signal, wherein the third CLK signal 1C at a Low level and the fourth CLK signal 1D at a High level are fixed to turn on the switching elements a1–a9, when the data is to be shifted in the forward direction, and the first CLK signal 1A at a Low level and the second CLK signal 1B at a High level are fixed to turn on the switching elements b1–b9, when the data is to be shifted in the reverse direction.

Figure 5:
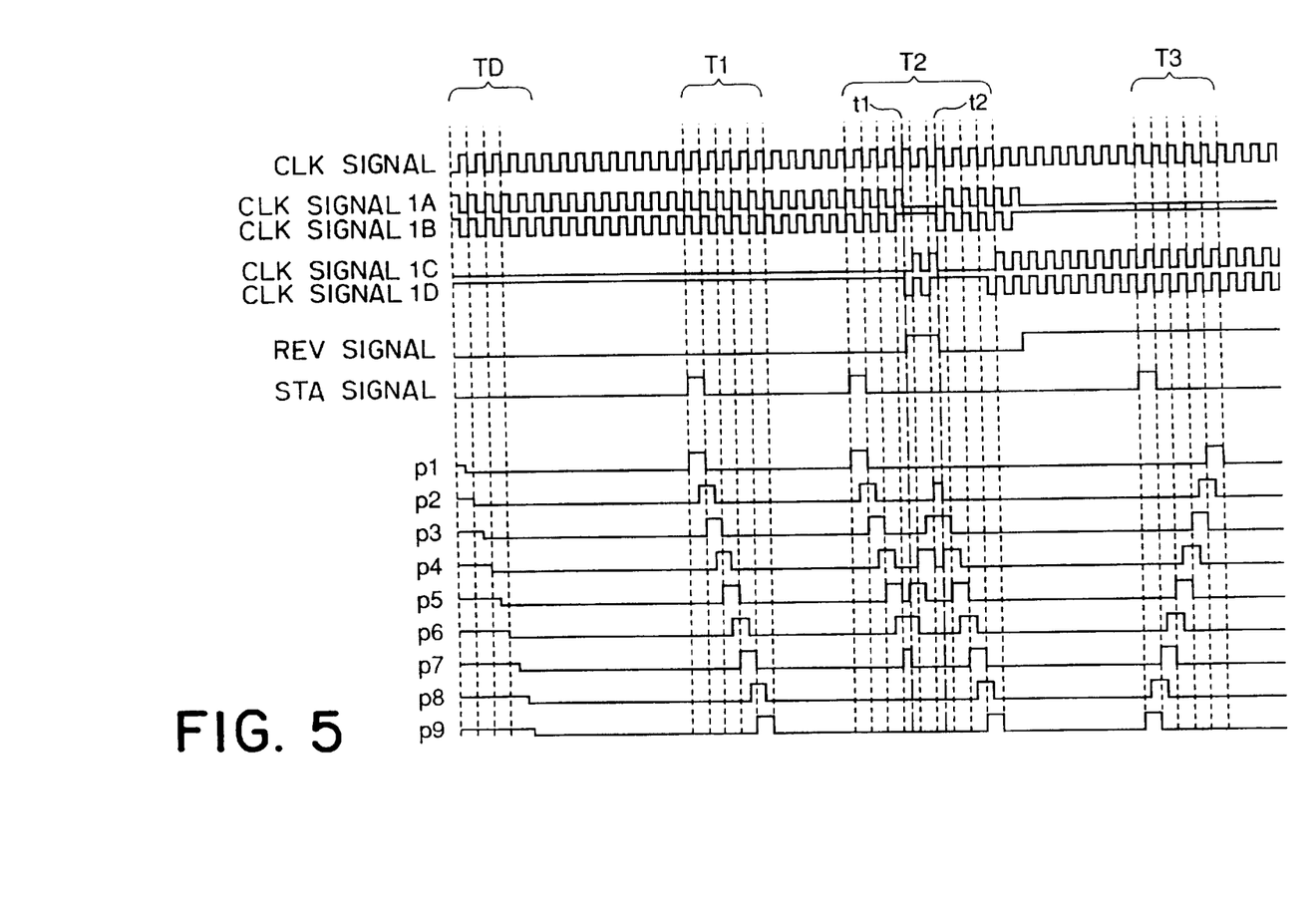
FIG. 5 is a timing chart for describing a signal processing operation in the bi-directional shift register illustrated in FIG. 4.

Referring to FIG. 5, the signal processing operation of the inner contacts p1–p9 positioned in a zigzag combination between inverters respectively connected with respective switching elements a1–a9 and respective switching elements b1–b9 in respective F/Fs is included in FIG. 5. The inner contact p1 is positioned between the switching element b1 and the inverter, the inner contact p2 between the switching element a2 and the inverter, the inner contact p3 between the switching element b3 and the inverter, the inner contact p4 between the switching element a4 and the inverter, the inner contact p5 between the switching element b5 and the inverter, the inner contact p6 between the switching element a6 and the inverter, the inner contact p7 between the switching contact b7 and the inverter, the inner contact p8 between the switching element a8 and the inverter, and the inner contact p9 between the switching element b9 and the inverter, respectively.

In the first place, an operation of T0 duration which is an initial state is described. In the initial state, the inner contacts p1–p9 are indefinite (whether at a Low level or at a High level is unknown and therefore, in the FIG. 5 they are shown at an intermediary level). Thereupon, in the duration of T0 in FIG. 5, illustration is made about the case where each of the inner contacts p1–p9, which are indefinite, is initialized to be a Low level.

Speaking specifically, in the duration of T0, if the REV signal is at a Low level, switching elements a1–a9 and d1 are turned on, the STA signal is at a Low level, and the CLK signal is subjected to clocking, a switching element d2 is turned on in a state where the switching elements b1, c1 are turned off during a Low level duration of the CLK signal, and the STA signal at a Low level is transferred to the inner contact p1 as data at a Low level.

Furthermore, when the CLK signal changes from a Low level to a High level, switching elements d2, b2, c2, are turned off, and switching element b1, c1, are turned on, thereby the data at the inner contact p1 is held in the F/F including the switching elements a1, b1, and transferred to the F/F including the next stage switching elements a2, b2, and the inner contact p2 also is at a Low level.

If the CLK signal changes from a High level to a Low level thereafter, the switching elements c1, b3, c3, are turned off, and the switching elements b2, c2, are turned on, thus the data at the inner contact p2 is held in the F/F including the switching elements a2, b2, and transferred to the F/F including the next stage switching elements a3, b3, and the inner contact p3 also is at a Low level. Repetition of the similar operation thereafter transfers the data transferred from the STA signal to the inner contact p1, sequentially to the inner contacts p2–p9 to initialize the shift register as a whole.

In T1 duration in FIG. 5, a case is illustrated that a state where all the inner contacts p1–p9 hold data at a Low level by the above-described initialization operation is changed, by putting the STA signal at a High level for one cycle duration of the CLK signal, to shift the data at a High level in the forward direction from the inner contact p1 to the inner contact p9. Moreover, the REV signal during the T1 duration is fixed at a Low level, and the switching elements a1–a9 are kept on (continuously being on).

Speaking specifically, when the STA signal changes from a Low level to a High level in a state where all the inner contacts p1–p9 are at a Low level state, the switching element d2 is opened by the CLK signal at a High level, and in the duration when the switching element b1 is turned off, the data at a High level of the STA signal is transferred to the inner contact p1. At this moment, the switching element c1 is turned off, and the data at a High level is held untransferred to the next stage F/F.

Furthermore, when the CLK signal changes from a High level to a Low level, the switching element d2 is turned off, the switching element b1 is turned on, and the data at a High level transferred from the STA signal to the inner contact p1 is held by the F/F including the switching elements a1, b1. Moreover, as the switching element c1 is turned on, and the switching elements b3, c3, are turned off simultaneously at this moment, the data at a High level held at the inner contact p1 is transferred to the F/F including the next stage switching elements a2, b2, and the inner contact p2 changes from a Low level to a High level.

Hereafter, when the STA signal is changed from a High level to a Low level and the CLK signal changes from a Low level to a High level, the switching element d2 is turned on and the switching elements b1, c1, are turned off to transfer the data at a Low level of the STA signal from the STA signal to the inner contact p1. At this moment, the F/F including the next stage switching elements a2, b2, holds the data at a High level transferred to the inner contact p2 as the switching element b2 is turned on and the switching element c1 is turned off, and transfers the data at a High level to the F/F including the second next stage switching element a3, b3, as the switching element c2 is turned on and the switching element b3 is turned off. Still more, even when the STA signal is changed from a High level to a Low level at the time point where the switching element d2 is closed, the data held at the inner contact p1 is not destroyed but, for the sake of simplifying the description, in FIG. 5, at the same time as the CLK signal is changed from a High level to a Low level, the STA signal is also changed.

Repetition of the similar operation shifts data at a High level inputted from the STA signal, as illustrated, sequentially to the inner contacts p1–p9 at every half cycle basis of the clocking of the CLK signal. At this time, as can be appreciated from an appearance of the illustration, in the process of shifting, the data is transferred being held normally by two F/Fs in such order as the inner contacts p1 and p2, the inner contacts p2 and p3, and the inner contacts p3 and p4.

With regard to T2 duration in FIG. 5, a note is made that, different from the duration of T1, after the data at a High level inputted from the STA signal by the similar operation as the above-described case is transferred to the inner contact p7, at the time point of t1 in the FIG. 5, the transfer direction of the data is changed from the forward direction to the reverse direction by switching the REV signal from a Low level to a High level, and further at the time point of t2, the REV signal is switched from a High level to a Low level to return the transfer direction of data from the reverse direction to the forward direction.

Speaking specifically, at the preceding of the t1 time point, the data at High level shifting inside a shift register is held by the F/F including the inner contact p6, because of a state where the switching elements b6, a6, c6, a7, are turned on while the switching elements c5, b7, c7, are turned off, and transferred to the FIF including the inner contact p7.

Subsequently, at the t1 time point, if the REV signal changes from a Low level to a High level, and the CLK signal further changes from a Low level to a High level, the switching elements b5, c5, b6, are turned on, thus the data held at the inner contact p6 is transferred to the inner contact p5, in other words, to the F/F of the preceding stage, conversely to the case where the REV signal is at a Low level. At this moment, further, as the switching element a6 is also turned on, the data at a High level at the inner contact p6 is to be held by the F/F including the inner contact p6. Furthermore, as the switching elements c6, a7, are turned off and the switching elements b7, c7, b8 are turned on, the data at a Low level held by the inner contact p8 is transferred to the inner contact p7.

Furthermore, when the CLK signal changes from a High level to a Low level, as the switching elements b4, c4, b5, a5, b6, c6, b7, a7, are turned on and the switching elements c3, a4, c5, a6, c7, are turned off, the data at a High level is held at the inner contact p5 and simultaneously transferred to the inner contact p4, and the data at a Low level at the inner contact p7 is held at the inner contact p7 and simultaneously transferred to the inner contact p6.

Thereafter, as the CLK signal 1A is fixed at a Low level during a High level duration of the REV signal, and the CLK signal 1B is fixed at a High level, the switching elements b1, b2, b3, b4, b5, b6, b7, b1, b9, are normally on, and the CLK signal 1C and the CLK signal 1D commence clocking in accordance with the clocking of the CLK signal, and commence on-off controlling of the switching elements a1, a2, a3, a4, a5, a6, a7, a1, a9, thus the data inside of the shift register shifts in the reverse direction.

Conversely to this, as at the t2 time point, if the REV signal again changes from a High level to a Low level, as the CLK signal 1C is fixed at a Low level during a Low level duration of the REV signal this time, and the CLK signal 1D is fixed at a High level, the switching elements a1–a9 are normally on, the CLK signal 1A and the CLK signal 1B commence clocking in accordance with the clocking of the CLK signal, and commence on-off controlling of the switching elements b1–b9, thus the data inside the shift register again shifts in the forward direction.

With regard to the operation of T3 duration in FIG. 5, the points to be noted are that, different from the duration of the T1, the REV signal is normally at a High level, resultantly, the switching element d1 is normally off, and instead thereof the switching element e1 is normally on, and that, in the similar way as the REV signal during a High level duration in the above-described T2 duration, as the CLK signal 1A is fixed at a Low level, and the CLK signal 1B is fixed at a High level, the switching elements b1, b2, b3, b4, b5, b6, b7, b1, b9, are normally on, and the CLK signal 1C and the CLK signal 1D commence clocking in accordance with the clocking of the CLK, and commence on-off controlling of the switching elements a1, a2, a3, a4, a5, a6, a7, a8, a9.

In the state, if the STA signal changes from a Low level to a High level in a state where all the inner contacts p1–p9 are in a Low level state, the switching element e2 turns on when the CLK signal is at a High level, and in the duration when the switching element a9 is off, the data at a High level of the STA signal is transferred to the inner contact p9. At this moment, the switching element C8 is turned off, and the data at a High level is held untransferred to the F/F of the preceding stage.

When the CLK signal changes from a High level to a Low level, the switching element e2 is turned off and the switching element a9 is turned on, thus the data at a High level transferred from the STA signal to the inner contact p9 is held by the F/F including the switching elements a9, b9.

Moreover, as the switching element c8 is turned on, and the switching elements a8, c7 are simultaneously turned off at this time, the data at a High level held at the inner contact p9 is transferred to the F/F including the preceding stage switching elements a8, b8, and the inner contact p8 changes from a Low level to a High level.

By the similar operation as the REV signal in the T2 duration is at a High level, the data at a High level inputted from the STA signal is sequentially shifted in the reverse direction to the inner contacts p9, p8, p7, . . . , p1.

In the above-described bi-directional shift register, all the switching elements are of structure made of a combination of NMOS transistors which are uncircled in FIG. 4 with PMOS transistors which are encircled in FIG. 4. But, instead thereof, the shift register may be composed only of NMOS transistors, and further, the inverters that constitute respective F/Fs may be exchanged with clocked inverters having switching function to obtain an equivalent function. Moreover, a control signal generator (a structure of NAND circuit or NOR circuit which is a logical circuit connected to an inverter at the preceding stage) for generating the CLK signal 1A, CLK signal 1B, CLK signal 1C, and CLK signal 1D here, is an example, and other structures may be utilized as long as the structures are circuits from which the similar wave-forms are obtainable.

Figure 6:
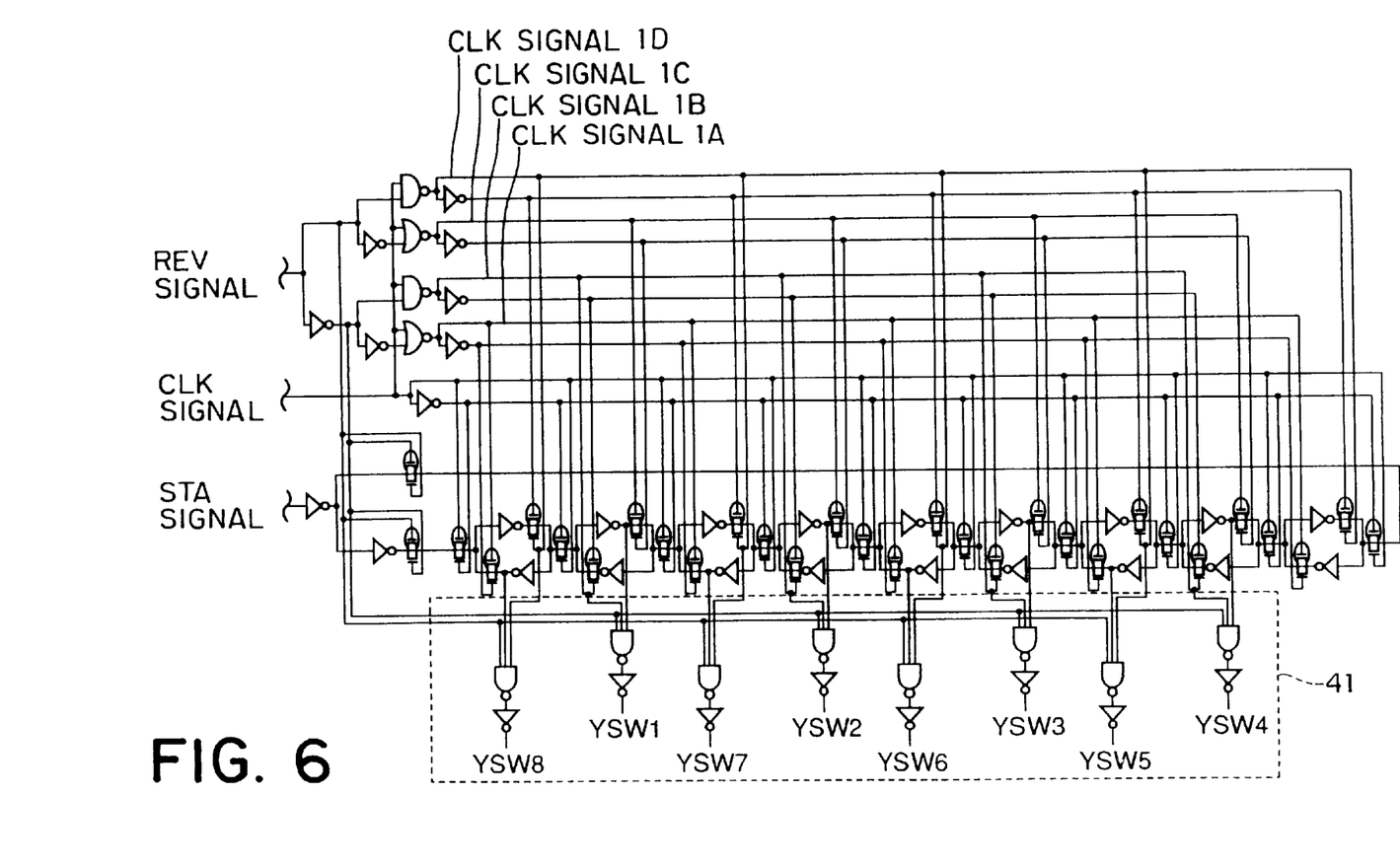
FIG. 6 is a circuit diagram of an address selector of DRAM that has the bi-directional shift register illustrated in FIG. 4.

Referring to FIG. 6, as a circuit that is to be added when the bi-directional shift register is applied as an address selector, for example, an output circuit 41 connected in series with an inverter encircled by a dotted line in FIG. 6 and a NAND circuit may be mentioned. The major part of the address selector is arranged such that an input signal (REV signal, CLK signal, STA signal) in a bi-directional shift register, inner contacts p1–p9, and an operating point switching position (showing NMOS transistors on the opposing side of switching elements a1, a3, a5, a7, and switching elements b2, b4, b6, b8) of switching elements are connected with an inputting side of the NAND circuit to obtain an output signal (address selecting signal) from an outputting side of the inverter via output lines YSW1-YSW8, and a signal processing operation as shown in the timing chart of FIG. 7 is done.

Figure 7:
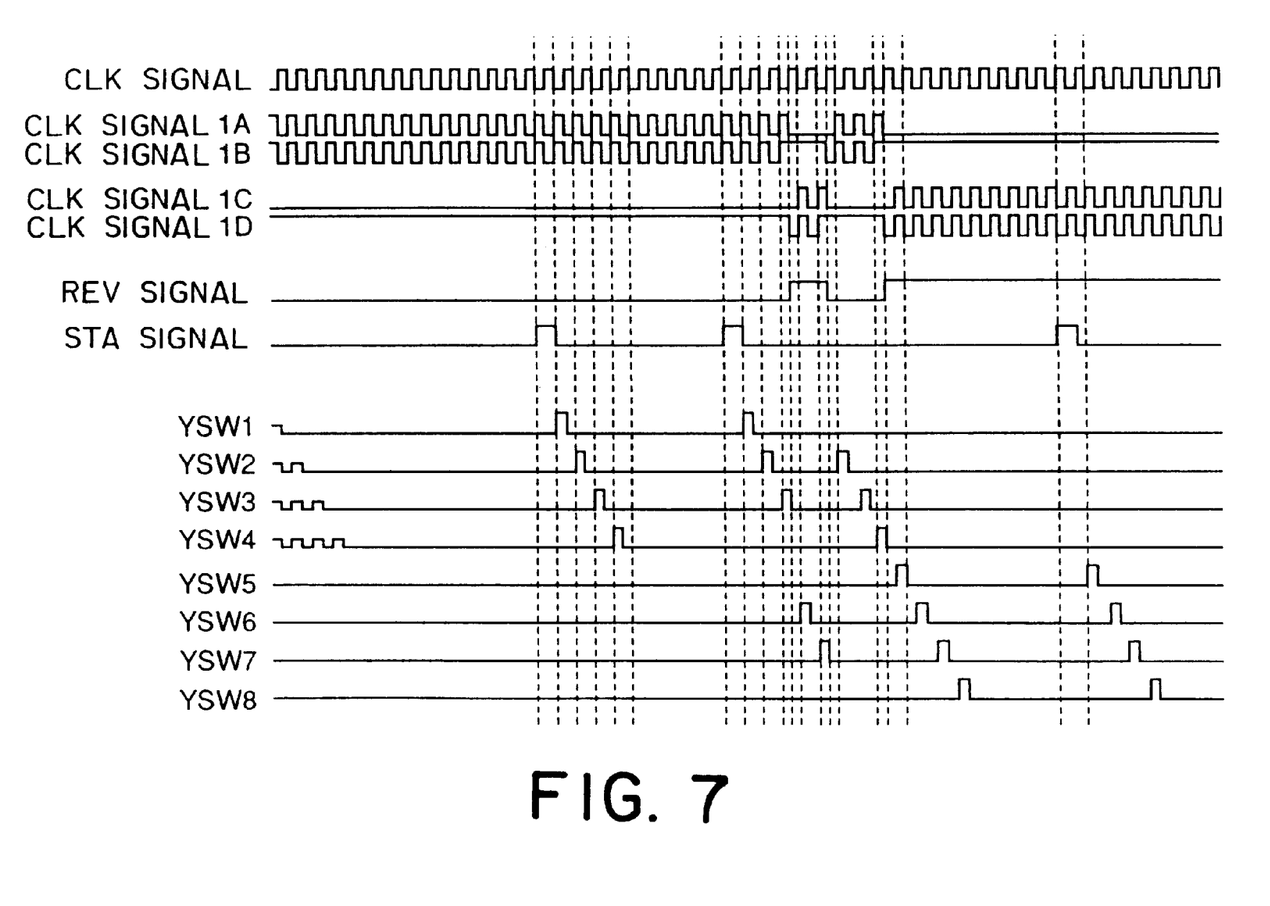
FIG. 7 is a timing chart for describing a signal processing operation in the address selector illustrated in in FIG. 6.

From FIG. 7 in the case of the major part of the address selector, a contrivance is noticed that an output circuit is added such that data at a High level is outputted only to any one of the signals of the output lines YSW1-YSW8 at a duration.

Figure 8:
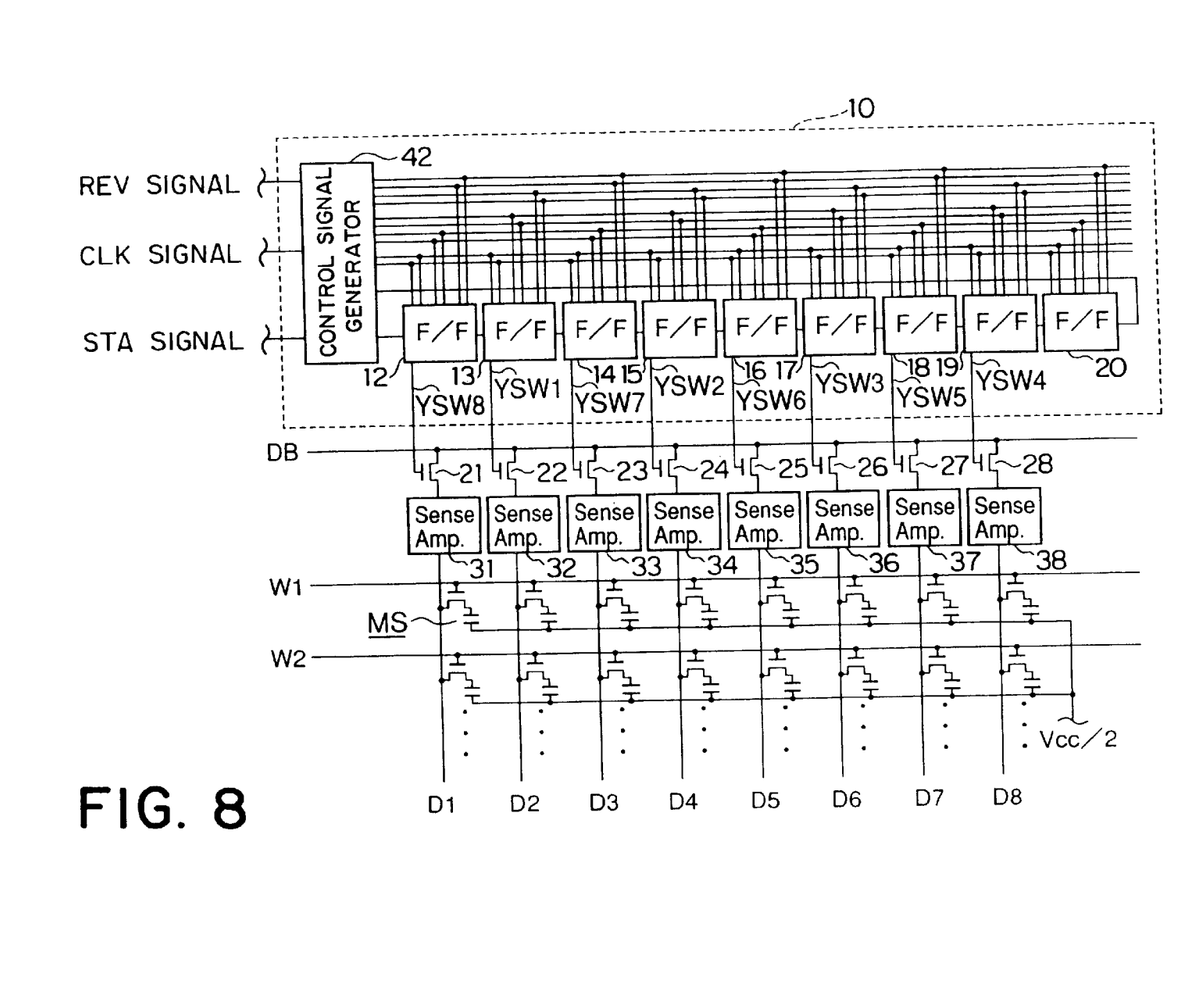
FIG. 8 is a block diagram of the address selector illustrated in FIG. 6.

In FIG. 8, the major part of the address selector shown in FIG. 6 is illustrated. The bi-directional shift register 10 comprises a control signal generator 42 and the flip-flops 12 to 20. The flip-flops 12 to 19 are connected to the switching elements 21 to 28, respectively. As in FIG. 8, this is a contrivance for preventing destruction each other of information from two sources on a data bus line DB in such a case when an address selector is constituted by being connected with a memory cell MS (source voltage of Vcc/2 is applied) of DRAM arranged between two paralleling word lines W1, W2, and digit lines D1–D8 of a number corresponding to the output lines YSW1-YSW8 via switching elements in a number corresponding to output lines YSW1-YSW8 connected with the data bus line DB and the same number of sense amplifiers connected with these switching elements (the portion encircled by a dotted line in FIG. 8 shows in a block the major part of the address selector in FIG. 6), for example, when the output line YSW8 and the output line YSW1 are simultaneously to be at High level, read-out information from the memory cell MS connected with the digit line D1 and read-out information from the memory cell MS connected with the digit line D2 destroy each other on the data bus line DB.

The bi-directional shift register of the structure illustrated in FIG. 4 is noticed to be improper by itself as an address selector, as clear from the timing chart shown in FIG. 5, since a duration exists when the inner contact p1 which is the original data of the output line YSW8 in FIG. 6 and the inner contact p2, which is the original data of the output line YSW1, are both at High level, but in the case of the major part of the address selector shown in FIG. 6, it becomes possible for a shift register having the same number of F/Fs to select two times an address by changing the F/F for extracting an address selecting signal for a forward route, and for a reverse route.

Figure 9:
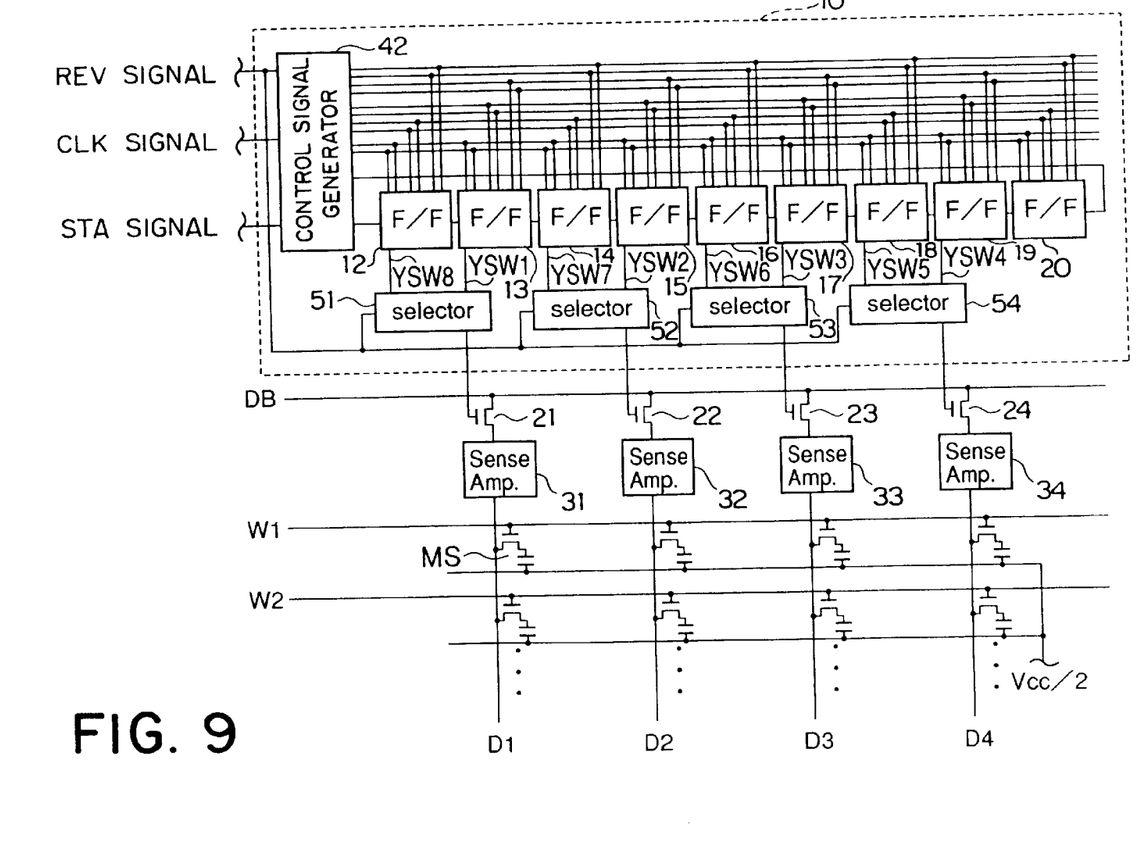
FIG. 9 is a circuit diagram of an FIFO/LIFO circuit having a FIFO function and a LIFO function that has address selector shown in FIG. 8.

FIG. 9 is a circuit diagram showing a basic structure of a FIFO/LIFO circuit using a modified circuit of the address selector of FIG. 5 described above, and having a FIFO (first-in, first-out) function that sequentially selects an address and a LIFO (last-in, first-out) function that sequentially selects an address in reverse order.

In the FIFO/LIFO circuit, the output circuit of the address selector of FIG. 8 is modified such that the REV signal is inputted as a selective control signal, two groups of output lines are formed by inputting sets of two lines out of the output lines YSW1–YSW8, and an output selector including a specific number (for example four) of selectors 51 to 54 for selectively outputting simultaneously either one of the two groups of output lines in accordance with the selective control signal is formed. In the four selectors, the output lines YSW8 and YSW1, the output lines YSW7 and YSW2, the output line YSW6 and YSW3, and the output lines YSW5 and YSW4 are inputted respectively as a set of two lines.

In the output selector, data is shifted in the forward direction at a Low level of the selective control signal and either one of the two groups of the output lines is selectively outputted simultaneously to form a FIFO function, and data is shifted in a reverse direction at a High level of selective control signal and the other of the two groups of output lines is selectively outputted simultaneously to form a LIFO function.

Speaking specifically, when an address is sequentially selected in an output selector, the REV signal is made a Low level to shift data in the forward direction in a shift register, and the data of output lines YSW1, YSW2, YSW3, and YSW4 is made effective by the selector controlled by the REV signal. When the address is sequentially selected in reverse order in the output selector, the REV signal is made a High level to shift the data in the reverse direction in the shift register, and the data of output lines YSW5, YSW6, YSW7, and YSW8 is made effective by the selector controlled by the REV signal.

According to the bi-directional shift register of this invention, as the switching elements on-off controlled by a forward route control signal and the switching elements are on-off controlled by a reverse route control signal are provided in the FIFs which constitute the shift register, a bi-directional shift function is implemented with a reduced number of elements in comparison with the conventional one, and as the result, integration degree as a semiconductor integrated circuit may be improved.

Specifically, points to be mentioned are that the number of elements constituting a bi-directional shift register is minimized and that integration degree as a semiconductor integrated circuit is improved. The reason is that, in comparison with a universal unidirectional shift register (moreover, a unidirectional shift register here may be shown by, for example, a shift register constituted by the F/Fs, shown in FIG. 1, from which switching elements a1–a9 are removed), the bi-directional transfer is made possible by adding only a switch in the F/Fs constituting the shift register.

Furthermore, a point to be mentioned is that the bi-directional data transfer function is made possible by curbing an increase in power consumption to the minimum. The reason is that the number of constituting elements is minimized and a data path is commonly owned by the forward route and the reverse route to curb an increase in the power consumption by transistors inside the shift register and on top of that a number of transistors for controlling is minimized to curb the power consumption by a control system of the shift register.

A point to be mentioned is that, as data transfer speed of the F/Fs in a shift register is uniform for the forward route and for the reverse route, the elimination is made possible of the necessity to consider the delay difference between the forward route and the reverse route in designing peripheral circuits for utilization of the read-out data from the shift register. The reason is that a data path is commonly used by the forward route and the reverse route.

While this invention has thus far been described in conjunction with the preferred embodiment thereof, it will readily be possible for those skilled in the art to put this invention into practice in various other manners.

What is claimed is:

1. An address selector comprising:
   a bi-directional shift register, said bi-directional shift register including
   a predetermined number of flip-flops each of which has a first switching element and a second switching element, said first switching element controlled to on and off states in accordance with a first control signal, said second switching element controlled to on and off states in accordance with a second control signal; and
   a plurality of third switching elements each connected in series between two adjacent respective flip-flops to constitute a multi-stage structure, said third switching elements controlled to on and off states in accordance with a third control signal which is for use in shifting data by periodically clocking from a low level to a high level or from a high level to a low level, said third control signal being a clock signal; and
   a control producing means for producing additional first to fourth clock signals different from one another in accordance with said clock signal and a REV signal which is for use in controlling a shift direction of said data;
   said control producing means putting said third and said fourth clock signals into a low level and a high level, respectively to make said first switching element be open when shift data are shifted to a forward direction, said first control signal including said third and said fourth clock signals, and
   said control producing means putting said first and said second clock signals into a low level and a high level, respectively, to make said second switching element be open when said data are shifted to a reverse direction, said second control signal including said first and said second clock signals;
   said address selector further comprising output means connected to said bi-directional shift register and having a plurality of output terminals for making one of said output terminals a high level to output an output signal as an address selector signal.

2. A FIFO/LIFO circuit having a FIFO and a LIFO function and comprising an address selector including a bi-directional shift register having
   a predetermined number of flip-flops, each of which has a first switching element and a second switching element, said first switching element controlled to on and off states in accordance with a first control signal, said second switching element controlled to on and off states in accordance with a second control signal; and
   a plurality of third switching elements each connected in series between two adjacent respective flip-flops to constitute a multi-stage structure, said third switching elements controlled to on and off states in accordance with a third control signal which is for use in shifting data by periodically clocking from a low level to a high level or from a high level to a low level, said third control signal being a clock signal; and
   a control producing means for producing additional first to fourth clock signals different from one another in accordance with said clock signal and a REV signal which is for use in controlling a shift direction of said data;
   said control producing means putting said third and said fourth clock signals into a low level and a high level, respectively, to make said first switching element be open when shift data are shifted to a forward direction, said first control signal including said third and said fourth clock signals, and
   said control producing means putting said first and said second clock signals into a low level and a high level, respectively, to make said second switching element be open when said data are shifted to a reverse direction, said second control signal including said first and said second clock signals;

said address selector comprising output means connected to said bi-directional shift register and having a plurality of output terminals for making one of said output terminals a high level to an output signal as an address signal;

said FIFO function selecting an address in forward order and said LIFO function selecting an address in reversed order, wherein:

said output means inputs said REV signal as a selection control signal and connects two sets of lines of said bi-directional shift register to form two groups of output terminals, and said output means comprises an output selector circuit for selectively outputting simultaneously either one of said two groups of output terminals in accordance with said selection control signal.

3. A FIFO/LIFO circuit as claimed in claim 1, wherein:

said output selector circuit shifts said data in the forward direction at a low level of said selection control signal to selectively output either one of said two groups of output terminal in said FIFO function; and said output selector circuit shifts said data in the reverse direction at a high level of said selection control signal to selectively output the other of said two groups of the output terminals in said LIFO function.

4. An address selector comprising a bi-directional shift register responsive to a REV signal which is for use in controlling a shift direction of data, said bi-directional shift register comprising:

a predetermined number of flip-flops each of which has first and second switching elements; and a plurality of third switching elements connected in series between two adjacent respective flip-flops to constitute a multi-stage structure, said third switching elements being controlled to on and off states in accordance with a basic clock signal which is for use in shifting said data by periodically clocking from a Low level to a High level or from a High level to a Low level;

shifting of said data to a forward direction being carried out by making said first switching element be in an on state during a Low level of said REV signal and by making said second switching element be in on and off states in accordance with said basic clock signal;

shifting of said data to a reverse direction being carried out by making said second switching element be in an on state during a High level of said REV signal and by making said first switching element be in on and off states in accordance with said basic clock signal;

said address selector further comprising a control signal generator for producing first through fourth clock signals different from one another in accordance with said basic clock signal and said REV signal;

said control producing means putting said third and said fourth clock signals into a Low level and a High level, respectively, to make said first switching element be in the on state when shifting of said data in said forward direction is carried out;

said control producing means putting said first and said second clock signals into a Low level and a High level, respectively, to make said second switching element be in the on state when shifting of said data in said reverse direction is carried out, said address selector being included in a FIFO/LIFO circuit, said FIFO/LIFO circuit having a FIFO function which sequentially selects an address, said FIFO/LIFO circuit having a LIFO function which sequentially selects an address in reverse order, wherein:

said address selector comprises output means connected to said bi-directional shift register and having a plurality of output terminals for making one of said output terminals be a High level to output an output signal as an address select signal;

said output means inputting said REV signal as a selection control signal and connecting two sets of lines of said bi-directional shift register to form two groups of output terminals, and said output means comprising an output selector circuit for selectively outputting simultaneously either one of said two groups of output terminals in accordance with said selection control signal.

* * * * *